United States Patent
Yamane et al.

(10) Patent No.: US 8,912,501 B2
(45) Date of Patent: Dec. 16, 2014

(54) OPTIMUM IMAGING POSITION DETECTING METHOD, OPTIMUM IMAGING POSITION DETECTING DEVICE, PHOTOMASK MANUFACTURING METHOD, AND SEMICONDUCTOR DEVICE MANUFACTURING METHOD

(71) Applicant: Kabushiki Kaisha Toshiba, Tokyo (JP)

(72) Inventors: Takeshi Yamane, Tsukuba (JP); Tsuneo Terasawa, Ome (JP)

(73) Assignees: Kabushiki Kaisha Toshiba, Tokyo (JP); Dai Nippon Printing Co., Ltd., Tokyo (JP)

( * ) Notice: Subject to any disclaimer, the term of this patent is extended or adjusted under 35 U.S.C. 154(b) by 92 days.

(21) Appl. No.: 13/841,049

(22) Filed: Mar. 15, 2013

(65) Prior Publication Data
US 2013/0244143 A1  Sep. 19, 2013

(30) Foreign Application Priority Data
Mar. 16, 2012  (JP) ................. 2012-060832

(51) Int. Cl.
*G01J 1/42* (2006.01)
*H04N 7/18* (2006.01)
*G03F 1/22* (2012.01)

(52) U.S. Cl.
CPC ... *G03F 1/22* (2013.01); *H04N 7/18* (2013.01)
USPC ...................................... 250/372

(58) Field of Classification Search
USPC ........................................ 250/372
See application file for complete search history.

(56) References Cited

U.S. PATENT DOCUMENTS

| 7,005,649 | B1 | 2/2006 | Tezuka et al. | |
|---|---|---|---|---|
| 7,630,068 | B2 * | 12/2009 | Tanaka et al. | 356/237.1 |
| 8,553,217 | B2 * | 10/2013 | Chuang et al. | 356/237.5 |
| 8,797,524 | B2 * | 8/2014 | Yamane et al. | 356/237.5 |
| 2003/0067598 | A1 | 4/2003 | Tomie | |
| 2006/0054836 | A1 * | 3/2006 | Tezuka et al. | 250/372 |
| 2009/0091752 | A1 * | 4/2009 | Terasawa et al. | 356/237.5 |
| 2011/0043811 | A1 * | 2/2011 | Yamane et al. | 356/446 |
| 2011/0181868 | A1 * | 7/2011 | Stokowski | 356/51 |
| 2012/0063667 | A1 * | 3/2012 | Yamane et al. | 382/144 |

FOREIGN PATENT DOCUMENTS

| JP | 5-80496 | 4/1993 |
|---|---|---|
| JP | 2004-158670 | 6/2004 |
| JP | 3728495 | 10/2005 |
| JP | 2006-80437 | 3/2006 |

* cited by examiner

*Primary Examiner* — Kiho Kim
*Assistant Examiner* — Taeho Jo
(74) *Attorney, Agent, or Firm* — Finnegan, Henderson, Farabow, Garrett & Dunner, LLP

(57) ABSTRACT

According to one embodiment, an optimum imaging position detecting method includes acquiring an image of a predetermined area of a substrate surface, calculating, on the basis of the image of the predetermined area, peak intensity corresponding to a value obtained by subtracting average signal intensity of an area outside an intensity acquisition part from signal intensity of the intensity acquisition part, calculating variation of the peak intensity, executing acquiring the image of the predetermined area, calculating the peak intensity, and calculating the variation of the peak intensity at each of a plurality of imaging positions, and determining that a position of the maximum variation of the peak intensity is an optimum imaging position.

20 Claims, 4 Drawing Sheets

OPTIMUM IMAGING POSITION DETECTING METHOD, OPTIMUM IMAGING POSITION DETECTING DEVICE, PHOTOMASK MANUFACTURING METHOD, AND SEMICONDUCTOR DEVICE MANUFACTURING METHOD

CROSS-REFERENCE TO RELATED APPLICATIONS

This application is based upon and claims the benefit of priority from Japanese Patent Application No. 2012-060832, filed Mar. 16, 2012, the entire contents of which are incorporated herein by reference.

FIELD

Embodiments described herein relate generally to an optimum imaging position detecting method, and the like.

BACKGROUND

When a defect is present in a mask blank, it becomes difficult to accurately transfer a mask pattern formed on a photomask to a semiconductor substrate. Accordingly, it is important to carry out a defect inspection of a mask blank in advance before manufacturing a photomask.

As a method of carrying out a defect inspection of a mask blank, a method of acquiring a dark-field image by using a dark-field optical system is known. When a defect is present in a mask blank, intense scattered light is created from the defective part. Accordingly, in a dark-field image, a defect is observed as a bright point. Therefore, in order to detect a defect signal, a threshold is set in advance, and a signal of a level higher than the threshold is judged to be a defect signal.

However, when the position of the mask blank deviates from the focus position, an image of the defect is not normally formed. For this reason, a problem that the intensity of the defect signal lowers, and the defect cannot be detected is caused. In order to detect the focus position, although it is sufficient if a pattern for detecting the focus position is provided, it is not possible to form a pattern on the mask blank in advance.

As described above, heretofore, it has been difficult to accurately detect a focus position on a substrate surface of a mask blank or the like.

Further, when the position (position based on, for example, a rotational angle of a TDI camera) of an optical system constituent component used for a defect inspection of a mask blank is not appropriate, it is not possible to carry out an inspection of a high degree of accuracy. Accordingly, it is also important to accurately detect the optimum position of the optical system constituent component.

As described above, a method by which it is made possible to accurately detect an optimum imaging position such as an optimum focus position or an optimum position of an optical system constituent component is desired.

DETAILED DESCRIPTION

In general, according to one embodiment, an optimum imaging position detecting method includes: acquiring an image of a predetermined area of a substrate surface; calculating, on the basis of the image of the predetermined area and for each of a plurality of intensity acquisition parts included in the predetermined area, peak intensity corresponding to a value obtained by subtracting average signal intensity of an area outside the intensity acquisition part from signal intensity of the intensity acquisition part; calculating variation of the peak intensity calculated for each of the plurality of intensity acquisition parts; executing acquiring the image of the predetermined area, calculating the peak intensity, and calculating the variation of the peak intensity at each of a plurality of imaging positions; and determining, on the basis of the variation of the peak intensity obtained at each of the plurality of imaging positions, that a position of the maximum variation of the peak intensity is an optimum imaging position.

Hereinafter, an embodiment will be described with reference to the drawings.

Figure 1:
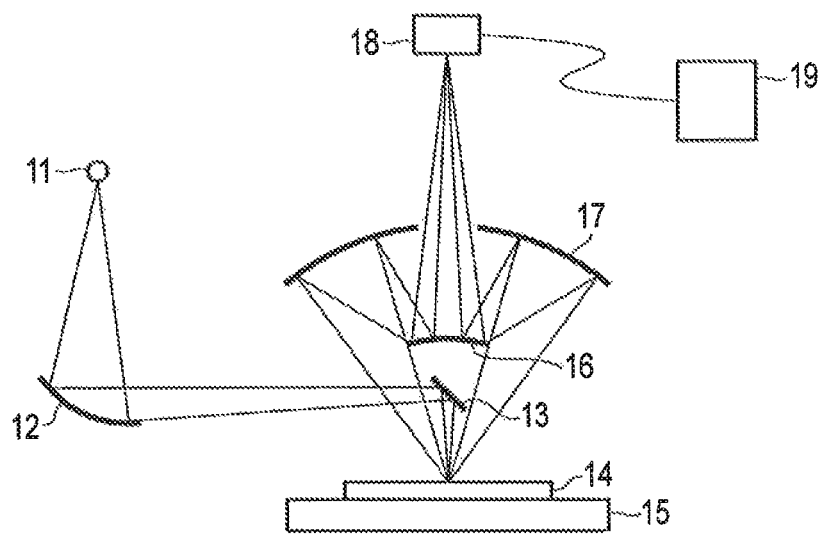
FIG. 1 is a view showing the schematic configuration of a focus position detecting device according to an embodiment.

FIG. 1 is a view showing the schematic configuration of a focus position detecting device (optimum imaging position detecting device) according to the embodiment.

Extreme ultraviolet (EUV) light from a light source 11 is applied to a substrate 14 through an elliptic mirror 12, and plane mirror 13. In this embodiment, a mask blank is used as the substrate 14. The mask blank 14 is a mask blank of a reflection-type photomask for EUV exposure. More specifically, the mask blank 14 includes a multilayer reflection film formed on a glass substrate. The mask blank 14 is placed on a stage 15 movable in an X direction, Y direction, and Z direction.

The light applied to the mask blank 14 is scattered from the surface of the mask blank 14. The scattered light components with a radiation angle smaller than a predetermined angle are shaded by a shading section (convex mirror) 16. The scattered light components with a radiation angle greater than the predetermined angle are collected by a concave mirror 17, and are made incident on the shading section (convex mirror) 16. The light components from the shading section (convex mirror) 16 are image-formed on an imaging area of a time delay integration (TDI) camera 18. The optical system described above is a dark-field optical system, and a dark-field image is taken in the TDI camera 18.

A signal based on an image obtained by the TDI camera 18 is sent to a personal computer 19 serving as an operation section, and processing for focus position detection, and processing for defect inspection are carried out in the personal computer 19.

Figure 2:
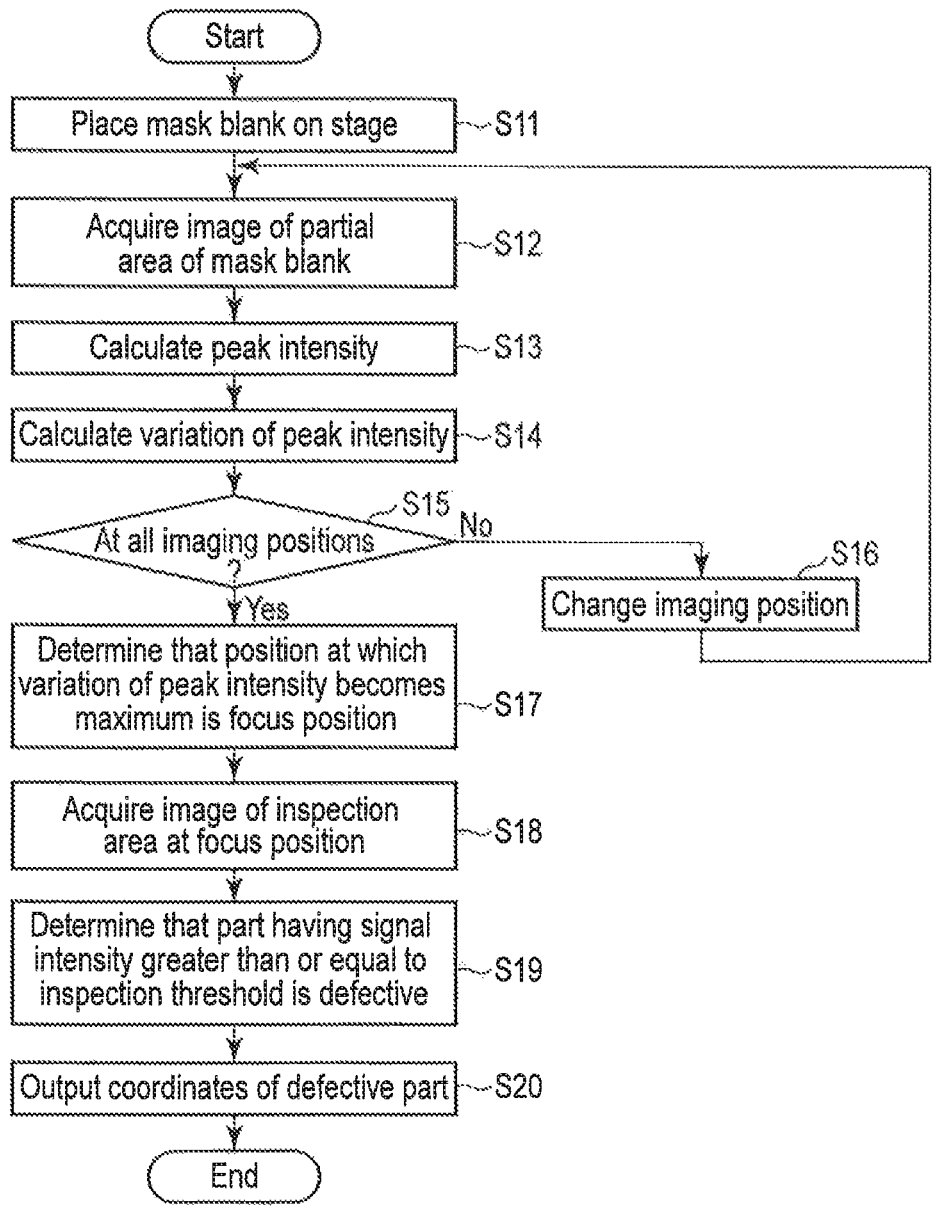
FIG. 2 is a flowchart showing a focus position detecting method, and defect inspecting method according to the embodiment.

FIG. 2 is a flowchart showing a focus position detecting method (optimum imaging position detecting method), and defect inspecting method according to the embodiment. Hereinafter, a description will be given by referring to the flowchart of FIG. 2.

First, the mask blank 14 is placed on the stage 15 (S11).

Figure 3:
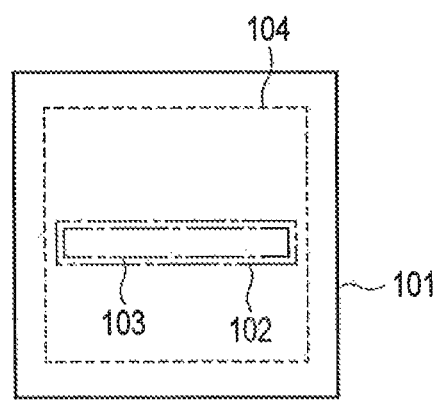
FIG. 3 is a view showing a partial area and inspection area of a mask blank.

Next, an image of a partial area (predetermined area) included in a surface (surface for pattern formation) of the mask blank 14 is acquired by using the above-mentioned dark-field optical system (S12). FIG. 3 is a view schematically showing a relationship between the mask blank 14 and above-mentioned partial area. In FIG. 3, a reference symbol 101 denotes the mask blank, 102 denotes the partial area, 103 denotes an inner area of the partial area to be described later, and 104 denotes an inspection area to be described later. The image of the partial area 102 is acquired by the TDI camera 18. The image acquired by the TDI camera 18 is obtained as a set of signals acquired by a plurality of pixels of the TDI camera 18. The partial area 102 is defined as an area of such a degree that bright points or dark points of the surface of the mask blank 14 are sufficiently included therein.

Next, peak intensity corresponding to a value obtained by subtracting average signal intensity of an area outside an intensity acquisition part from signal intensity of the intensity acquisition part is calculated for each of a plurality of intensity acquisition parts included in the partial area 102 on the basis of the image of the partial area (predetermined area) (S13). Hereinafter, a method of calculating the peak intensity will be specifically described.

Figure 4:
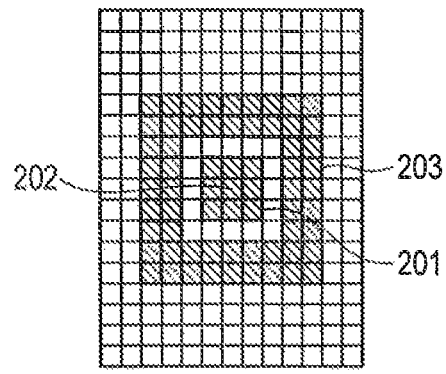
FIG. 4 is a view showing an intensity acquisition part.

FIG. 4 is a view showing an intensity acquisition part. As shown in FIG. 4, the intensity acquisition part 201 includes a plurality of pixels (central pixel 202 and pixels around the central pixel 202). In this embodiment, the intensity acquisition part 201 is constituted of a 3×3 pixel area. Outside the intensity acquisition part 201, an average signal intensity acquisition area 203 surrounding the intensity acquisition part 201 is set. In this embodiment, the average signal intensity acquisition area 203 is an area obtained by removing, from the 9×9 pixel area, a 5×5 pixel area inside the 9×9 pixel area.

When the peak intensity is to be calculated, first, average signal intensity of the average signal intensity acquisition area 203 is calculated. More specifically, signal intensity is acquired for all the pixels included in the average signal intensity acquisition area 203, and then art average value (simple average value) of those signal intensity values is obtained. Regarding the intensity acquisition part 201, signal intensity is acquired for each of the pixels included in the intensity acquisition part 201. Further, the average signal intensity of the average signal intensity acquisition area 203 is subtracted from the signal intensity of each of the pixels included in the intensity acquisition part 201. Furthermore, the sum total of values obtained for all the pixels by the subtractions is calculated. In this embodiment, the sum total of nine subtraction values obtained for the nine pixels (3×3 pixels) is calculated. The sum total of the subtraction values obtained in this way corresponds to the peak intensity. The above-mentioned calculation processing of the peak intensity is carried out for each of the plurality of intensity acquisition parts 201.

Roughness is generally present on the surface of a mask blank, and hence slight scattering occurs even when no defect is present. Accordingly, a certain level of signal intensity is observed from an image obtained by the dark-field optical system even when there is no defect. That is, such background intensity is included in the image obtained from the mask blank. By subtracting the average signal intensity by the method described above, it is possible to acquire appropriate intensity from which the background intensity is excluded.

It should be noted that it is desirable that the intensity acquisition part 201 be set in such a manner that the degree of the intensity acquisition part 201 is comparable with the size of the bright point or the dark point based on a defect (phase defect or defect resulting from extraneous matter). Further, as described above, the average signal intensity obtained in the average signal intensity acquisition area 203 corresponds to the background intensity. Accordingly, it is desirable that the average signal intensity acquisition area 203 be set in such a manner that the average signal intensity acquisition area 203 becomes sufficiently larger than the size of the bright point or the dark point. Further, it is desirable that the average signal intensity acquisition area 203 be set in such a manner that the average signal intensity acquisition area 203 is not too distant from the intensity acquisition part 201 in order that the area 203 can be free from an influence of the illumination distribution of the light source.

Further, the intensity acquisition part 201 is set for all the pixels except a certain area near the outer circumference of the partial area 102 of FIG. 3. That the intensity acquisition part 201 is set for each of all the pixels in the inner area 103 of FIG. 3. The intensity acquisition part 201 is constituted of a plurality of pixels (3×3 pixels in this embodiment), and hence intensity acquisition parts 201 adjacent to each other overlap each other. In the certain area (4-pixel width area) near the outer circumference of the partial area 102, it is not possible to define a 9×9 pixel area having a central pixel 202 in the center thereof. Accordingly, no intensity acquisition part 201 having each of pixels included in the certain area (4-pixel width area) near the outer circumference in the center thereof is set.

Next, variation of the peak intensity calculated for each of the plurality of intensity acquisition parts 201 in the manner described above is calculated (S14). That is, variation of the peak intensity calculated for each intensity acquisition part 201 having each pixel in the inner area 103 of FIG. 3 in the center thereof is calculated. More specifically, a standard deviation of the peak intensity is calculated as the variation of the peak intensity.

Above-mentioned steps S12, S13, and S14 are executed for each of a plurality of imaging positions. That is, steps S12, S13, and S14 are executed while the imaging position is changed until steps S12, S13, and S14 are completely executed at all the imaging positions (S15 and S16). The plurality of imaging positions are set by moving the stage 15. More specifically, the plurality of imaging positions are set in a direction perpendicular to the surface of the stage 15. That is, the plurality of imaging positions are set in the optical axis direction of the TDI camera 18. It should be noted that the TDI camera 10 may be moved in the optical axis direction instead of moving the stage 15. The setting range of the plurality of imaging positions is set sufficiently wide so that the focus position is securely included therein. The plurality of imaging positions are set by dividing the setting range set sufficiently wide in this way by a predetermined width.

Next, on the basis of the variation of the peak intensity obtained at each of the plurality of imaging positions, it is determined that a position of the maximum variation of the peak intensity is the focus position. More specifically, it is determined that an imaging position at which the variation of the peak intensity becomes the maximum among the plurality of imaging positions is the focus position (S17). In general, the intensity of each of a bright point and dark point obtained by the dark-field optical system becomes the maximum or the minimum at the focus position. Further, the intensity of the bright point or the dark point becomes closer to the background intensity as the position thereof becomes farther from the focus position. Accordingly, the variation of the peak intensity also becomes the maximum at the focus position, and becomes smaller as the position becomes farther from the focus position. Thus, it is determined that among the plurality of imaging positions, the imaging position at which the variation of the peak intensity becomes the maximum is the focus position.

Next, the stage 15 is moved in such a manner that the mask blank 14 is positioned at the focus position obtained in the manner described above. Further, at the focus position, the image of the inspection area 104 shown in FIG. 3 is acquired by means of the TDI camera 18 (S18).

Next, it is determined on the basis of the image of the inspection area 104 that a part having signal intensity greater than or equal to a predetermined inspection threshold is defective (S19).

Furthermore, coordinates of the part regarding which it is determined in step S19 that the part is defective are output (S20).

As described above, in this embodiment, by determining that an imaging position at which the variation of the peak intensity becomes the maximum among a plurality of imaging positions is the focus position, it becomes possible to accurately detect the focus position of the mask blank. Further, in this embodiment, it is possible to accurately detect a focus position by calculating the variation of the peak intensity without grasping the position of the bright point or the dark point of the mask blank surface. In general, the intensity of the bright point or the dark point becomes the maxim or the minimum at the focus position, and hence although a scheme to detect a focus position from the intensity of a bright point or a dark point is conceivable, it is necessary to grasp the position of the bright point or the dark point, and thus it is not easy to detect a focus position from the intensity of the bright point or the dark point. In the method of this embodiment, it is not necessary to grasp the position of the bright point or the dark point, and hence it becomes possible to detect a focus position accurately and easily.

Further, in this embodiment, the peak intensity obtained by subtracting the average signal intensity of an area outside the intensity acquisition part from the signal intensity of the intensity acquisition part is calculated for each of a plurality of intensity acquisition parts included in the partial area (predetermined area) of the mask blank surface, it is therefore possible to acquire the appropriate intensity from which the background intensity is removed.

Figure 5:
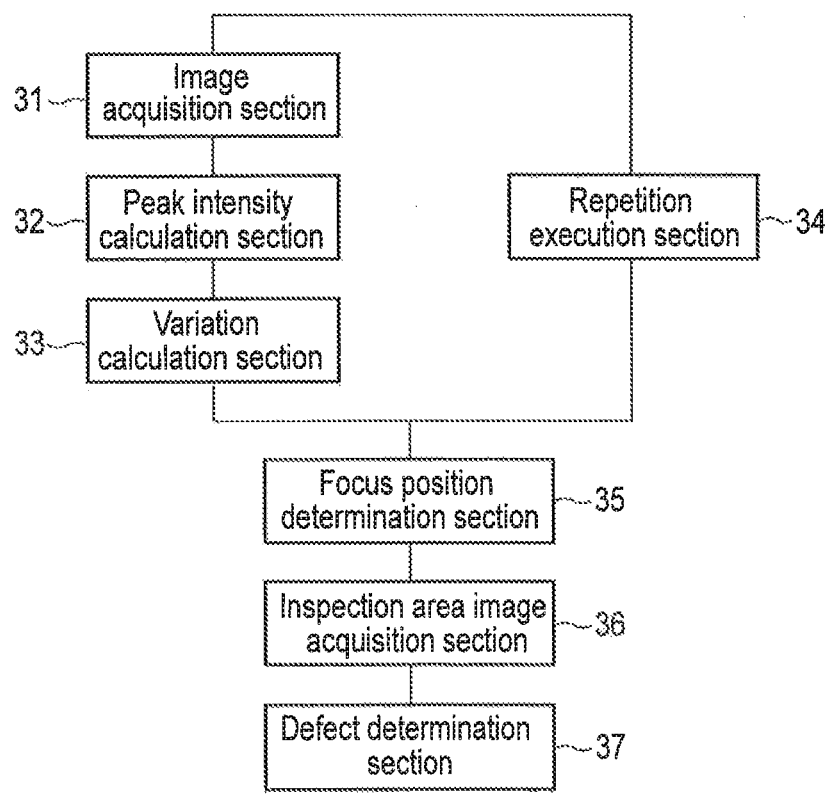
FIG. 5 is a functional block diagram showing the configuration used to execute various processing items of the embodiment.

FIG. 5 is a functional block diagram showing the configuration used to execute various processing items described above. The above-mentioned various processing items are mainly executed by the computer 19.

In the configuration shown in FIG. 5, an image acquisition section 31, peak intensity calculation section 32, variation calculation section 33, repetition execution section 34, focus position determination section (optimum imaging position determination section) 35, inspection area image acquisition section 36, and defect determination section 37 are provided.

The image acquisition section 31 is configured to acquire an image of a predetermined area (partial area) of the substrate surface. The peak intensity calculation section 32 is configured to calculate the peak intensity corresponding to a value obtained by subtracting the average signal intensity of an area outside the intensity acquisition part from the signal intensity of the intensity acquisition part for each of a plurality of intensity acquisition parts included in the predetermined area on the basis of an image of the predetermined area. The variation calculation section 33 is configured to calculate variation of the peak intensity calculated for each of the plurality of intensity acquisition parts. The repetition execution section 34 is configured to cause acquisition of an image of the predetermined area, calculation of the peak intensity, and calculation of the variation of the peak intensity to be repetitively executed at a plurality of imaging positions. The focus position determination section (optimum imaging position determination section) 35 is configured to determine that a position at which the variation of the peak intensity is the maximum is a focus position (optimum imaging position) on the basis of the variation of the peak intensity obtained at each of the plurality of imaging positions. The inspection area image acquisition section 36 is configured to acquire an image of the inspection area of the mask blank surface. The defect determination section 37 is configured to determine that a part having signal intensity greater than or equal to the inspection threshold is defective on the basis of the image of the inspection area. The function and operation of each section are as already described previously.

Figure 6:
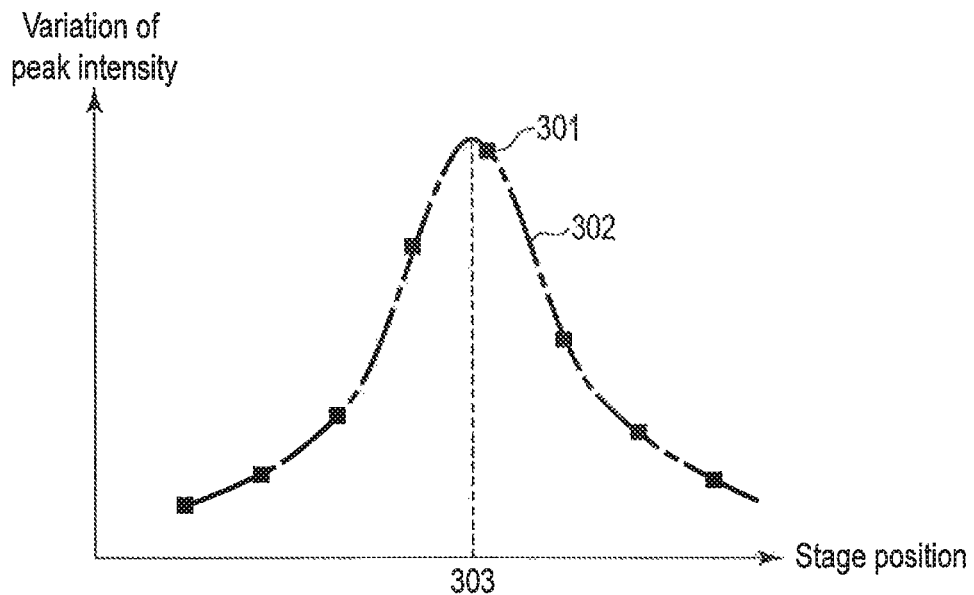
FIG. 6 is a view showing a modification example of the embodiment.

It should be noted that in the embodiment described above, the plurality of imaging positions have been set by dividing the setting range set sufficiently wide so that the focus position can be securely included therein by the predetermined width. Further, at all the imaging positions (division positions) set in this way, the variation of the peak intensity has been obtained. Normally, when a relationship between the variation of the peak intensity and imaging position (stage position) is plotted, a single local maximum value is obtained as shown in FIG. 6. Accordingly, when the variation of the peak intensity monotonously increases with respect to the stage position, it is possible to predict that there is the focus position in the positive direction. Further, when the variation of the peak intensity monotonously decreases with respect to the stage position, it is possible to predict that there is the focus position in the negative direction. Thus, the stage is moved by the predetermined width in the predicted direction to thereby obtain variation of the peak intensity. Further, a plot 301 obtained in this way is subjected to fitting processing, whereby an approximate curve 302 is obtained. It is determined that the maximum position 303 of the obtained approximate curve 302 is a focus position. By using such a method, it is possible to shorten the time required to detect the focus position.

Further, in the embodiment described above, although the intensity acquisition part has been constituted of a plurality of pixels (3×3 pixels in the above example), the intensity acquisition part may also be constituted of one pixel.

Further, in the embodiment described above, although a dark-field optical system is used as imaging means, and a mask blank is used as the substrate, the above-mentioned method is not limited to these. When the acquired defect image is an image constituted of a bright point and/or a dark point, it is possible to apply the above-mentioned method. For example, it is also possible to use an imaging system such as a scanning electron microscope as the imaging means.

Further, the method of the above-mentioned embodiment is applicable to a manufacturing method of a photomask, and manufacturing method of a semiconductor device.

Figure 7:
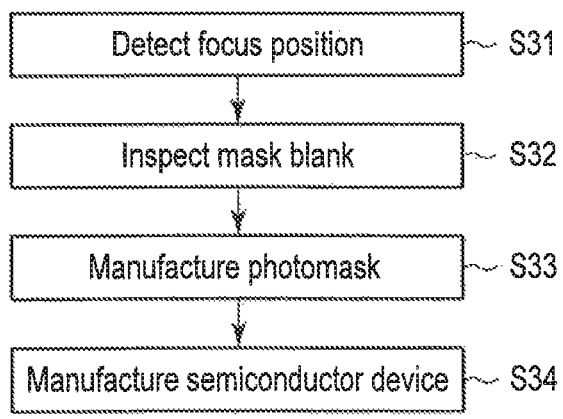
FIG. 7 is a flowchart showing a manufacturing method of a photomask, and manufacturing method of a semiconductor device.

FIG. 7 is a flowchart showing a manufacturing method of a photomask, and manufacturing method of a semiconductor device. First, a focus position of a mask blank is detected by the method of the above-mentioned embodiment (S31). Next, the mask blank is inspected at the detected focus position (S32). Next, a photomask is manufactured by using the inspected mask blank (S33). Furthermore, a semiconductor device is manufactured by using the manufactured photomask (S34). More specifically, a mask pattern (circuit pattern) formed on the photomask is transferred to a photoresist on a semiconductor substrate. Subsequently, the photoresist is developed, and a photoresist pattern is formed. Furthermore, by using the photoresist pattern as a mask, a conductive film, insulating film, semiconductor film or the like is etched.

Further, in the above-mentioned embodiment, although the focus position detecting method has been described as the optimum imaging position detecting method, the method of the above-mentioned embodiment is also applicable to detection of an optimum imaging position of an optical system constituent component. For example, when an optimum rotational angle of a TDI camera is to be detected, the method of the above-mentioned embodiment can be applied.

When the rotational angle of the TDI camera is an optimum angle, i.e., when the imaging position of the TDI camera based on the rotational angle is the optimum position, the defect image (defect signal) has sharp peak intensity. On the other hand, as the rotational angle of the TDI camera deviates from the optimum rotational angle, the defect image gradually extends, and the peak intensity of the defect signal gradually lowers. Accordingly, by changing the rotational angle of the TDI camera instead of changing the distance from the TDI camera to the mask blank, it is possible to detect the optimum rotational angle by using the same method as the method of the above-mentioned embodiment. That is, variation of the peak intensity is calculated at a plurality of imaging positions based on the rotational angle, and it is determined that the imaging position (rotational angle) at which the variation of the peak intensity becomes the maximum is the optimum imaging position (optimum rotational angle).

As described above, by using the same method as the optimum imaging position detecting method described in the above-mentioned embodiment for detection of an optimum imaging position of an optical system constituent component, such as detection or the like of an optimum rotational angle of a TDI camera, it is possible to carry out detection or the like of a defect at the optimum imaging position.

As described above, according to this embodiment, it becomes possible to accurately detect the optimum imaging position such as an optimum focus position, and optimum position of an optical system constituent component.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An optimum imaging position detecting method comprising:
   acquiring an image of a predetermined area of a substrate surface;
   calculating, on the basis of the image of the predetermined area and for each of a plurality of intensity acquisition parts included in the predetermined area, peak intensity corresponding to a value obtained by subtracting average signal intensity of an area outside the intensity acquisition part from signal intensity of the intensity acquisition part;
   calculating variation of the peak intensity calculated for each of the plurality of intensity acquisition parts;
   executing acquiring the image of the predetermined area, calculating the peak intensity, and calculating the variation of the peak intensity at each of a plurality of imaging positions; and
   determining, on the basis of the variation of the peak intensity obtained at each of the plurality of imaging positions, that a position of the maximum variation of the peak intensity is an optimum imaging position.

2. The method of claim 1, wherein the intensity acquisition part includes a plurality of pixels.

3. The method of claim 2, wherein calculating the peak intensity includes
   acquiring, for each of the plurality of intensity acquisition parts, signal intensity for each of pixels included in the intensity acquisition part;
   subtracting, for each of the plurality of intensity acquisition parts, the average signal intensity from the signal intensity acquired for each of the pixels included in the intensity acquisition part; and
   calculating, for each of the plurality of intensity acquisition parts, a sum total of values obtained for the pixels by the subtractions.

4. The method of claim 1, wherein the substrate is a mask blank.

5. The method of claim 4, wherein the mask blank is a mask blank for a reflection-type photomask for EUV exposure.

6. A photomask manufacturing method comprising manufacturing a photomask by using a mask blank an optimum imaging position of which is detected by the method of claim 4.

7. A semiconductor device manufacturing method comprising manufacturing a semiconductor device by using the photomask manufactured by the method of claim 6.

8. The method of claim 1, wherein the image of the predetermined area of the substrate surface is acquired by using a dark-field optical system.

9. The method of claim 1, wherein the variation of the peak intensity includes a standard deviation of the peak intensity.

10. The method of claim 1, wherein the plurality of imaging positions are set in a direction perpendicular to a surface of a stage on which the substrate is to be placed.

11. The method of claim wherein the image of the predetermined area of the substrate surface is acquired by a TDI camera.

12. An optimum imaging position detecting device comprising:
    an image acquisition section configured to acquire an image of a predetermined area of a substrate surface;
    a peak intensity calculation section configured to calculate, on the basis of the image of the predetermined area and for each of a plurality of intensity acquisition parts included in the predetermined area, peak intensity corresponding to a value obtained by subtracting average signal intensity of an area outside the intensity acquisition part from signal intensity of the intensity acquisition part;
    a variation calculation section configured to calculate variation of the peak intensity calculated for each of the plurality of intensity acquisition parts;
    an execution section configured to execute acquiring the image of the predetermined area, calculating the peak intensity, and calculating the variation of the peak intensity at each of a plurality of imaging positions; and
    an optimum imaging position determination section configured to determine, on the basis of the variation of the peak intensity obtained at each of the plurality of imaging positions, that a position of the maximum variation of the peak intensity is an optimum imaging position.

13. The device of claim 12, wherein the intensity acquisition part includes a plurality of pixels.

14. The device of claim 13, wherein calculating the peak intensity by means of the peak intensity calculation section includes acquiring, for each of the plurality of intensity acquisition parts, signal intensity for each of pixels included in the intensity acquisition part;

subtracting, for each of the plurality of intensity acquisition parts, the average signal intensity from the signal intensity acquired for each of the pixels included in the intensity acquisition part; and calculating, for each of the plurality of intensity acquisition parts, a sum total of values obtained for the pixels by the subtractions.

15. The device of claim 12, wherein the substrate is a mask blank.

16. The device of claim 15, wherein the mask blank is a mask blank for a reflection-type photomask for EUV exposure.

17. The device of claim 12, wherein the image of the predetermined area of the substrate surface is acquired by using a dark-field optical system.

18. The device of claim 12, wherein the variation of the peak intensity includes a standard deviation of the peak intensity.

19. The device of claim 12, wherein the plurality of imaging positions are set in a direction perpendicular to a surface of a stage on which the substrate is to be placed.

20. The device of claim 12, wherein the image acquisition section includes a TDI camera.

* * * * *